United States Patent
Lev et al.

(10) Patent No.: US 8,357,429 B2
(45) Date of Patent: Jan. 22, 2013

(54) METHODS FOR FORMING ARTICLES HAVING APERTURES AND ARTICLES HAVING SUBSTANTIALLY REDUCED RESIDUAL COMPRESSIVE STRESS

(75) Inventors: Leonid C. Lev, West Bloomfield, MI (US); Jon T. Carter, Farmington, MI (US); Yang T. Cheng, Troy, MI (US); Carolina C. Ang, Bloomfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 57 days.

(21) Appl. No.: 12/979,916

(22) Filed: Dec. 28, 2010

(65) Prior Publication Data
US 2011/0097513 A1    Apr. 28, 2011

Related U.S. Application Data

(62) Division of application No. 11/680,777, filed on Mar. 1, 2007, now Pat. No. 7,879,402.

(60) Provisional application No. 60/777,791, filed on Mar. 1, 2006.

(51) Int. Cl.
*C23C 16/00* (2006.01)
*C23C 16/27* (2006.01)

(52) U.S. Cl. ............... 427/249.8; 427/248.1; 427/249.1

(58) Field of Classification Search .................. None
See application file for complete search history.

(56) References Cited

U.S. PATENT DOCUMENTS

| | | | |
|---|---|---|---|
| 4,248,820 A | 2/1981 | Haataja | |
| 5,397,228 A | 3/1995 | Metten | |
| 5,620,745 A * | 4/1997 | Simpson | 427/249.8 |
| 6,053,653 A | 4/2000 | Tanaka et al. | |
| 6,134,919 A | 10/2000 | Anderson et al. | |
| 6,219,930 B1 | 4/2001 | Reid | |
| 6,652,762 B2 * | 11/2003 | Baik et al. | 216/41 |
| 6,843,946 B1 | 1/2005 | Haataja | |
| 2004/0185291 A1* | 9/2004 | Cheng et al. | 428/615 |
| 2005/0069709 A1* | 3/2005 | Lev et al. | 428/408 |
| 2006/0220322 A1* | 10/2006 | McCormick et al. | 277/442 |

FOREIGN PATENT DOCUMENTS

WO    WO 2006043780 A1 *    4/2006

OTHER PUBLICATIONS

Chalker et al., Thin Film Diamond Sensor Technology, Phys. Stat. Sol (A), 154, 455-466, 1996.*
Umeda, Kazunori, et al "Formation of Self-Lubricating Surface Layer by High Speed Injection of Graphite Powders", Japanese Society of Tribologists, May 2003, Tokyo.
International Search Report for S.N. PCT/US2007/63053 dated Mar. 1, 2008 (10 pages).

* cited by examiner

*Primary Examiner* — Michael Cleveland
*Assistant Examiner* — Francisco Tschen
(74) *Attorney, Agent, or Firm* — Dierker & Associates, P.C.

(57) ABSTRACT

A method for forming an aperture includes stamping an aperture into the article using a pellet, and refining aperture shape(s) and/or aperture dimensions. Methods for forming articles having reduced residual compressive stress are also disclosed. Very generally, the methods include establishing a diamond coating on at least a portion of a substrate, and applying a stress-relief process to the diamond coating, the substrate, or combinations thereof.

2 Claims, 1 Drawing Sheet

METHODS FOR FORMING ARTICLES HAVING APERTURES AND ARTICLES HAVING SUBSTANTIALLY REDUCED RESIDUAL COMPRESSIVE STRESS

CROSS REFERENCE TO RELATED APPLICATIONS

This application is a divisional of U.S. patent application Ser. No. 11/680,777, now U.S. Pat. No. 7,879,402 filed on Mar. 1, 2007 which claims the benefit of U.S. Provisional Patent Application Ser. No. 60/777,791, filed on Mar. 1, 2006.

TECHNICAL FIELD

The present disclosure relates generally to methods for forming articles having apertures, and also to methods for forming articles having substantially reduced residual compressive stress.

BACKGROUND

Drilling is a process that is generally used to cut an aperture into an article, and tapping is a process that is generally used to form or cut a thread inside of an aperture.

Conventional drilling or tapping processes are relatively slow for forming apertures in articles. Stamping or forging processes offer a quicker process then drilling, however, such processes may result in less precise apertures. Stamping or forging a thread in an aperture may not be feasible depending, at least in part, on the condition of the aperture and/or the precision and surface quality of the aperture walls.

Furthermore, some metals are soft, chemically active, and have a strong tendency to adhere to tool surfaces during machining (e.g., aperture formation). Diamond coatings have been applied to tools to provide a hard surface with low friction. Such coatings are chemically inert, which substantially prevents the metals (e.g., the workpiece) from sticking to the tool.

One potential problem with diamond coatings is that the residual compressive stress may increase in the coating as the article cools from the deposition temperature to room temperature. Such stress may, in some instances, result in the diamond coating delaminating from the substrate material. Such residual stress may develop as a result of the large coefficient of thermal expansion (CTE) mismatch between the diamond coating and the substrate material.

SUMMARY

A method for forming an aperture in an article is disclosed herein. The method includes stamping an aperture into the article using a pellet, and refining aperture shape(s) and/or aperture dimensions via drilling or tapping.

A method for correcting the aperture in an article is also disclosed. The method includes forming an aperture in the article, filling the aperture with a pellet, and refining the aperture shape by forming or cutting a thread in the aperture.

Methods for forming articles having reduced residual compressive stress are also disclosed. Very generally, the methods include establishing a diamond coating and applying a stress-relief process to the coating and/or to the substrate.

Some methods for forming articles having reduced residual compressive stress include vibrating the substrate as the coating is established, or incorporating expansion joint(s) in the coating.

Another method for forming an article having reduced residual compressive stress includes elastically compressing a substrate during establishment of the diamond coating, and then releasing the compression as the coated substrate cools.

Still another method for forming an article having reduced residual compressive stress includes establishing a diamond coating on an austenite crystal structure substrate, and cooling the substrate to transform it to a martensite crystal structure.

Still further, a method for forming an article having reduced residual compressive stress includes establishing a diamond coating on an annealed substrate that is capable of transforming between austenite and martensite phases. The coated substrate is then cooled, and reheated so it is in its austenite phase. After heating, the coated substrate is quenched so it is in its martensite phase.

BRIEF DESCRIPTION OF THE DRAWINGS

Features and advantages of embodiments of the present disclosure will become apparent by reference to the following detailed description and drawings. For the sake of brevity, reference numerals or features having a previously described function may not necessarily be described in connection with other drawings in which they appear.

DETAILED DESCRIPTION OF THE EMBODIMENTS

Generally, some of the articles described herein have an aperture formed therein, and other articles include a substrate and a diamond coating/layer. It is to be understood that the diamond coated substrates may also have apertures formed therein using embodiment(s) of the method disclosed herein for forming such apertures.

Figure 1:
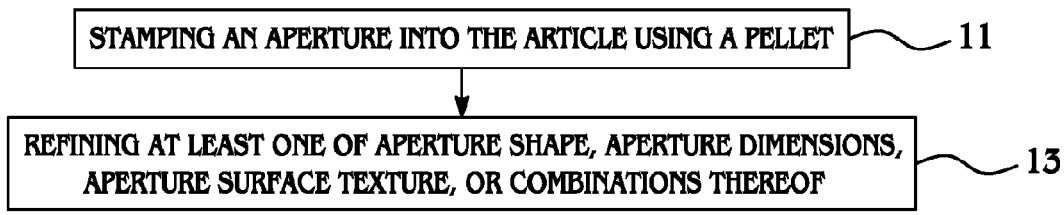
FIG. 1 is a flow diagram depicting an embodiment of the method for forming an aperture in an article.

FIG. 1 depicts an embodiment of the method for forming an aperture in an article. The method generally includes stamping an aperture into the article using a pellet, as shown at reference numeral 11; and refining at least one of aperture shape, aperture dimensions, or combinations thereof, as shown at reference numeral 13. Embodiments of the method shown in FIG. 1 are discussed further in reference to FIG. 2.

Figure 2:
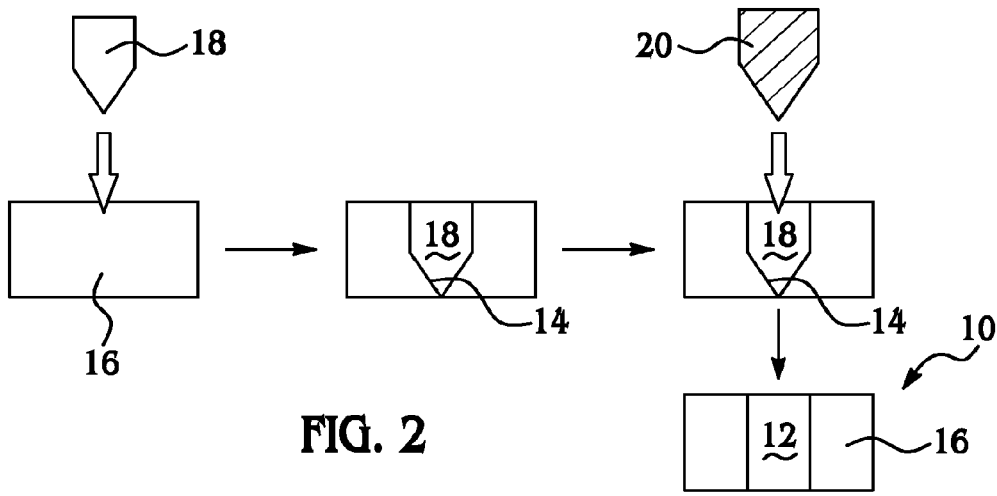
FIG. 2 is a cross-sectional schematic diagram depicting an embodiment of the method of FIG. 1.

Referring now to FIG. 2, the formation of an aperture 12 in an article 10 using an embodiment of the method of FIG. 1 is shown. Generally, the method shown in FIG. 2 includes stamping or forging an initial aperture 14 using a pellet 18, and then refining the aperture shape and/or dimensions using a drill to form the final aperture 12.

As shown in FIG. 2, stamping the initial aperture 14 into the substrate 16 is accomplished using the pellet 18. The pellet 18 may be driven into the substrate 16 via mechanical pressure, gas pressure, and/or combinations thereof. As further shown in FIG. 2, the initial aperture 14 created by the pellet 18 may be of a smaller diameter and/or depth than the final aperture 12.

Generally, the pellet 18 is formed of a substance with a relatively low melting temperature. In an embodiment, the pellet 18 is an ice pellet (e.g., containing frozen water or a frozen suspension of lubricant in water), a $CO_2$ pellet, or a $CO_2$ pellet having particles of ice, lubricant(s), oil(s), and/or combinations thereof suspended substantially throughout its volume. The pellet may have other gasses present substantially throughout its volume, such as, for example, nitrogen ($N_2$). The pellet 18 may have solid lubricant (e.g., graphite, molybdenum disulfide ($MoS_2$), tungsten disulfide ($WS_2$)) or high-pressure oil lubricant suspended substantially throughout its volume. In an embodiment in which a $CO_2$ pellet is used, it is to be understood that the lubricant can be frozen at the temperature at which $CO_2$ is solidified. The pellet 18 may have any desirable size and/or shape (non-limitative examples of which include pin shaped, cylinder shaped, or taper shaped). In an embodiment, the hardness of the ice pellet 18 is about 6 GPa, and increases as the pellet temperature is lowered. It is to be understood that the selected pellet 18 is harder than the selected substrate 16 (e.g., aluminum alloy), and thus the pellet 18 is capable of effectively deforming the substrate 16.

After the pellet 18 is driven into the substrate 16, the initial aperture 14 shape and/or dimensions may be refined, as desired, using a drill 20. As shown in FIG. 2, after drilling takes place, the refined aperture 12 is formed. In an embodiment, the machine used for drilling the aperture 14 is also capable of shooting or driving pellet(s) 18 into the substrate 16 immediately prior to initiating drilling. Alternatively, the pellet(s) 18 may be driven into the substrate 16 via a separate machine, such as, for example, a stamping machine or press. In the latter embodiment, the substrate 16 having the pellet 18 therein is moved to a drilling machine, a lathe, or a machining center, where the shape and/or dimensions of the initial aperture 12 are refined.

In a non-limiting example, the initial aperture 14 is refined substantially immediately after it is stamped into the substrate 16 and/or after the pellet 18 is driven into the substrate 16. In an embodiment in which an ice pellet 18 is used, the pellet 18 melts under the heat generated during drilling and provides cooling and lubrication during the drilling process. In an embodiment in which a $CO_2$ pellet 18 is used, the pellet 18 provides cooling during the drilling process. In an embodiment in which a $CO_2$ pellet 18 having frozen lubricant(s) therein is used, the lubricant melts under the heat generated during drilling, and thus the pellet 18 provides cooling and lubrication during the drilling process.

The aperture 14 shape may also be corrected or altered by driving a hard tool into the aperture 14, and inducing plastic deformation of the substrate 16 in which the aperture 14 is formed. As a non-limiting example, after the initial aperture 14 is formed, a ball may be driven through the aperture 14 to adjust the diameter and/or the surface quality/texture of the aperture 14. In some embodiments, a thread may be formed inside of the aperture 14 using plastic deformation.

Without being bound to any theory, it is believed that the combination of stamping and drilling substantially eliminates the stock around the center of the drill 20 (i.e., where the cutting speed and cutting efficiency of the drill 20 is generally low). Furthermore, it is believed that the combination substantially improves the centering of the drill 20 for refining the initial aperture 14 to form the final aperture 12.

The method may also include forming a thread inside the aperture 12, 14. In one embodiment, threading may be accomplished via tapping or, as previously stated, via plastic deformation. It is to be understood that refining (e.g., drilling) and tapping may occur substantially simultaneously or sequentially. In an embodiment in which simultaneous drilling and tapping occur, the pellet 18 may be treaded so that when driven into the substrate 16, the threaded aperture 12, 14 is formed.

In still another embodiment, the thread is formed after the pellet 18 is driven into the substrate 16. In this embodiment, the pellet 18 does not have any thread, but a thread may be desirable for the final aperture 12. The heat of cutting the thread inside the initial aperture 14 melts the pellet 18. The molten pellet 18 provides the lubrication that may be desirable during thread cutting.

Figure 3:
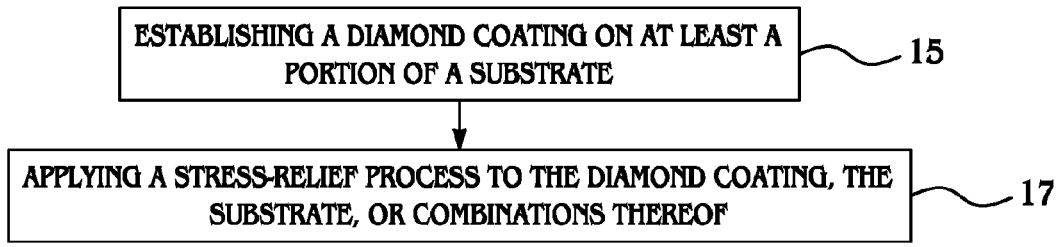
FIG. 3 is a flow diagram depicting an embodiment of the method for forming a diamond coated article having substantially reduced residual compressive stress.

Also disclosed herein are various methods for forming diamond coated articles having substantially reduced residual compressive stress. FIG. 3 depicts a general embodiment of such methods, which includes establishing a diamond coating on at least a portion of a substrate, as shown at reference numeral 15, and applying a stress-relief process to the diamond coating, the substrate, or combinations thereof, as shown at reference numeral 17. It is to be understood that the stress-relief process may be performed as the coating is established, after the coating is established, or both during and after the coating the established.

Without being bound to any theory, it is believed that various embodiments of the method shown in FIG. 3 advantageously decrease the residual compressive stress in the diamond coating, thereby increasing the adhesion between the substrate and the diamond coating.

Each embodiment of the method includes establishing a diamond coating on at least a portion of the substrate. This may be accomplished via arc jet diamond coating deposition, or chemical vapor deposition (CVD), for example, using a hot filament method or a plasma-assisted method.

The substrates used in these methods may be a metallic material, a ceramic composite material, or a material that is capable of transforming between an austenite and martensite phase (described further hereinbelow). Non-limitative examples of metallic substrates include high-speed steel or stainless steel. Both of these metallic materials are alloys of iron (Fe) with carbon (C) and/or other alloying elements. A non-limiting example of the ceramic composite substrate includes cemented carbide, which has a structure of carbide grains bound together by a metal material. The carbide grains include, but are not limited to tungsten carbide (WC) grains, titanium carbide (TiC) grains, vanadium carbide (VC) grains, tantalum carbide (TaC) grains, and/or the like, and/or combinations thereof. Cobalt and nickel are examples of metal materials. The metal material acts as a tough "glue" or "cement", holding together hard but brittle carbide grains ("blocks").

It is to be understood that any suitable stress-relief process may be used, including, but not limited to thermal stress-relief processes, vibratory stress-relief processes, magnetic stress-relief processes, cryogenic stress-relief process, and/or the like, and/or combinations thereof. It is to be understood that such processes may be modified for use with coated substrates in order to maximize the amount of stress relief. Some examples of such process modifications include modifications to the temperature, the vibration intensity, and/or the medium used. Still further, it may be desirable to repeat the stress-relief process(es), to use different stress-relief process(es) sequentially, or to combine such processes.

In one embodiment of forming a diamond coated article having substantially reduced residual compressive stress, the diamond coating is established as the substrate is vibrated. The intensity and/or duration of the vibration may vary, depending, at least in part, on the materials used, the stress-relief desired, or the like.

Another embodiment of a method of forming the reduced stress diamond coated article includes elastically compressing a substrate during establishment of the diamond coating. Examples of compressible substrates include those formed of high-speed steel, stainless steel, cemented carbide, or the like. Non-limiting examples of such substrates/articles include inserts, cutting edges, etc. It is to be understood that such substrates may be compressed by applying compressing force, for example, by loading the substrates during the deposition of the diamond coating.

In one embodiment, the elastically compressible substrate is compressed prior to diamond coating deposition, and remains compressed during the diamond coating deposition. In this embodiment, the diamond coating deposition takes place at a predetermined temperature. The predetermined temperature for this embodiment generally ranges from about 500° C. to about 850° C. After the coating is established, the compression is gradually released as the coated substrate cools. Elastically compressing the substrate may be accomplished using a mechanical fixture, hydrostatic pressure, and/or combinations thereof.

Still another method for forming an article having reduced residual compressive stress includes using a substrate capable of forming and switching between an austenite and a martensite phase. It is to be understood that the density of the austenite phase is greater than the density of the martensite phase, such that when the mass of the substrate/article is preserved, its volume increases. It is to be further understood that at diamond deposition temperatures, the substrate is in its austenite phase, and upon cooling, the substrate is in its martensite phase.

Non-limiting examples of substrates that are capable of switching between martensite and austenite phases include those formed of high-speed steel, stainless steel, and/or the like, and/or combinations thereof. Generally, suitable temperatures for deposition are above approximately 750° C., which is the martensite transformation temperature for such materials.

Generally, this embodiment of the method includes establishing the diamond coating on the substrate having an austenite crystal structure. The coated substrate is then cooled, thus allowing the substrate to transform it to its martensite crystal structure. Cooling may be accomplished using various cooling techniques to accelerate or slow the cooling process. Without being bound to any theory, it is believed that the expansion that accompanies the transformation partially offsets the thermal shrinkage, thereby reducing the residual stress in the coated article.

Another embodiment of the method for forming an article having reduced residual compressive stress includes using an annealed substrate that is capable of transforming between austenite and martensite phases. In this embodiment, the diamond coating is established at a predetermined temperature on the annealed substrate. The predetermined temperature ranges from about 700° C. to about 900° C. The coated article is then cooled below the predetermined temperature.

After cooling to about room temperature, the coated article is heated so that the substrate transforms to its austenite phase. The coated article is then cooled either slowly or rapidly, and as it is quenched, it transforms to its martensite phase. Again, without being bound to any theory, it is believed that the expansion that accompanies the austenite/martensite transformation partially offsets the thermal shrinkage, thereby reducing the residual stress in the coated article.

Figure 4:
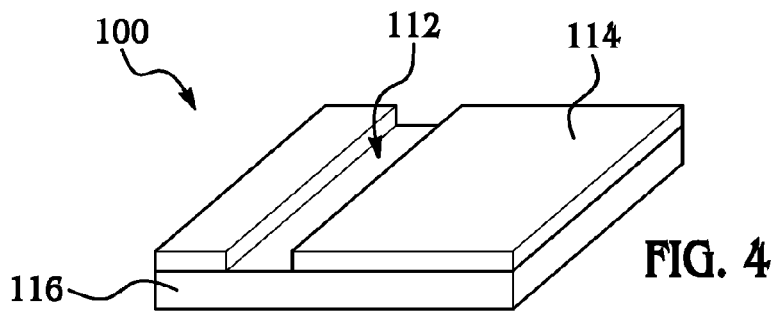
FIG. 4 is a schematic diagram of an embodiment of a diamond coated article having an expansion joint formed in the diamond coating.

Still another embodiment of forming an article having reduced residual compressive stress includes forming an expansion joint in the diamond coating. FIG. 4 depicts a diamond coated article 100 having expansion joint(s) 112 formed therein. The expansion joint(s) 112 are generally narrow regions on the substrate 116 which are substantially free of the diamond coating 114. As the substrate 116 cools from the diamond deposition temperatures to room temperature, the substrate 116 shrinks more than the diamond coating 114 and closes the expansion joints 112. The method for forming this article 100 generally includes establishing the diamond coating 114 on the substrate 116, and incorporating expansion joint(s) 112 in the coating 114.

In one embodiment, the coating 114 is established on substantially the entire substrate 116 surface. The expansion joint(s) 112 are incorporated by selectively removing at least a portion of the diamond coating 114 from the substrate 116. It is to be understood that the selective removal may be accomplished by any suitable method(s).

In another embodiment, incorporating the expansion joint(s) 112 is accomplished substantially simultaneously with establishing the diamond coating 114. This is accomplished by selectively establishing the diamond coating 114 on the substrate 116 so that at least an area of the substrate 116 is free of the diamond coating 114. It is believed that selective deposition may reduce the build up of residual stress during cooling of the article 100.

In one embodiment of the method, the expansion joint 112 may be filled with a solid lubricant. An example of a solid lubricant is graphite, molybdenum disulfide ($MoS_2$), tungsten disulfide ($WS_2$), or combinations thereof.

While the joints 112 shown in FIG. 4 are substantially straight, it is to be understood that the expansion joint(s) 112 may have any predetermined or random, regular or non-regular geometric pattern (e.g., rounded islands) and/or configuration. Non-limitative examples of expansion joint geometry patterns/configurations include line(s), circle(s), oval(s), rectangle(s), square(s), polygon(s), and/or combinations thereof.

Furthermore, without being bound to any theory, it is believed that the addition of expansion joint(s) 112 reduces the total stress in the coating 114 during subsequent metal cutting (e.g., when the article is a tool).

Some of the methods described herein advantageously form substantially precise apertures. Other methods described herein advantageously form articles having decreased residual compressive stress in the diamond coating, thereby increasing the adhesion between the substrate and the diamond coating.

While several embodiments have been described in detail, it will be apparent to those skilled in the art that the disclosed embodiments may be modified. Therefore, the foregoing description is to be considered exemplary rather than limiting.

The invention claimed is:

1. A method for forming a diamond coated article having substantially reduced residual compressive stress, the method comprising:
   selectively depositing, at a predetermined deposition temperature, a diamond coating on at least a portion of a substrate so that at least an area of the substrate is free of the diamond coating and so that at least one expansion joint is incorporated into the diamond coating, thereby forming a diamond coated substrate; and
   cooling the diamond coated substrate, whereby the substrate shrinks more than the diamond coating and closes the at least one expansion joint.

2. The method as defined in claim 1 wherein the at least one expansion joint has a predetermined geometric pattern selected from a line, a circle, an oval, a rectangle, a square, a polygon, and combinations thereof.

* * * * *